(12) United States Patent
Lee et al.

(10) Patent No.: US 12,489,037 B2
(45) Date of Patent: Dec. 2, 2025

(54) SEMICONDUCTOR PACKAGE SUBSTRATE WITH A SMOOTH GROOVE STRADDLING TOPSIDE AND SIDEWALL

(71) Applicant: TEXAS INSTRUMENTS INCORPORATED, Dallas, TX (US)

(72) Inventors: Bob Lee, New Taipei (TW); Kim Hong Lucas Chai, Dresden (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 422 days.

(21) Appl. No.: 18/104,278

(22) Filed: Jan. 31, 2023

(65) Prior Publication Data
US 2024/0258210 A1    Aug. 1, 2024

(51) Int. Cl.
*H01L 23/495*  (2006.01)
*H01L 21/56*   (2006.01)
*H01L 23/00*   (2006.01)
*H01L 23/31*   (2006.01)

(52) U.S. Cl.
CPC ........ *H01L 23/49541* (2013.01); *H01L 21/56* (2013.01); *H01L 23/3107* (2013.01); *H01L 23/49513* (2013.01); *H01L 23/49582* (2013.01); *H01L 24/32* (2013.01); *H01L 24/48* (2013.01); *H01L 24/73* (2013.01); *H01L 24/83* (2013.01); *H01L 24/85* (2013.01); *H01L 24/92* (2013.01); *H01L 2224/26175* (2013.01); *H01L 2224/32245* (2013.01); *H01L 2224/48245* (2013.01); *H01L 2224/48465* (2013.01); *H01L 2224/73265* (2013.01); *H01L 2224/83855* (2013.01); *H01L 2224/858* (2013.01); *H01L 2224/92247* (2013.01)

(58) Field of Classification Search
CPC .......... H01L 23/3242; H01L 23/49541; H01L 23/49575; H01L 23/49513; H01L 24/29; H01L 24/32; H01L 24/45; H01L 24/48; H01L 24/83; H01L 24/85; H01L 24/92; H01L 2224/48465; H01L 2224/73265; H01L 2224/48245; H01L 2224/858; H01L 2224/92247; H01L 2224/26175; H01L 2224/83855; H01L 2224/32245
See application file for complete search history.

(56) References Cited

U.S. PATENT DOCUMENTS 6,828,660 B2   12/2004   Abbott
7,183,657 B2   2/2007    Furtaw et al.
7,358,617 B2   4/2008    Cruz et al.
8,044,495 B2   10/2011   Abbott
(Continued)

*Primary Examiner* — Khiem D Nguyen
(74) *Attorney, Agent, or Firm* — Dawn Jos; Frank D. Cimino

(57) ABSTRACT

A semiconductor package includes a metallic substrate, the metallic substrate including a roughened surface, a semiconductor die including bond pads, and an adhesive between the roughened surface of a topside of the metallic substrate and the semiconductor die, therein bonding the semiconductor die to the metallic substrate. The adhesive includes a resin. The metallic substrate further includes a groove about a perimeter of the semiconductor die on the roughened surface, the groove having a surface roughness less than a surface roughness of the roughened surface of the metallic substrate. The groove straddles the topside and a sidewall of the metallic substrate.

14 Claims, 7 Drawing Sheets

(56) References Cited

U.S. PATENT DOCUMENTS

| | | |
|---|---|---|
| 8,158,460 B2 | 4/2012 | Abbott |
| 8,587,099 B1 | 11/2013 | Abbott |
| 9,054,092 B2 | 6/2015 | Gallegos et al. |
| 2007/0269930 A1 | 11/2007 | Gupta et al. |
| 2013/0025745 A1 | 1/2013 | Abbott et al. |
| 2013/0154117 A1 | 6/2013 | Tan et al. |
| 2018/0166420 A1 | 6/2018 | Park et al. |
| 2019/0074431 A1 | 3/2019 | Hasegawa et al. |
| 2019/0311974 A1* | 10/2019 | Hashizume ......... H01L 23/3142 |
| 2020/0273813 A1 | 8/2020 | Wee et al. |
| 2021/0193590 A1* | 6/2021 | Wang ..................... G06T 7/70 |
| 2023/0017286 A1 | 1/2023 | Zhang et al. |

\* cited by examiner

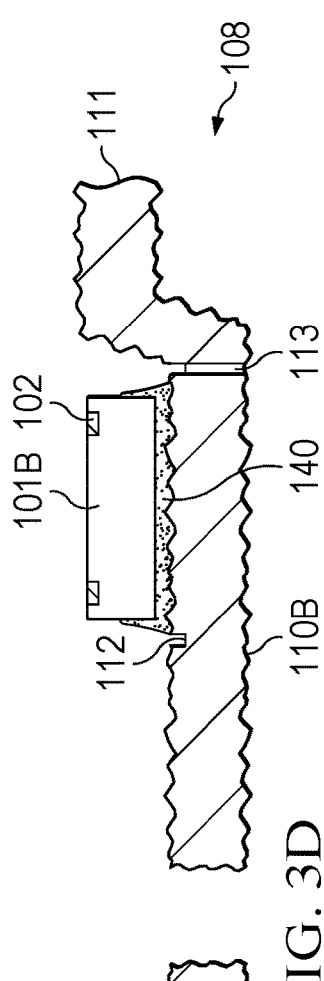
FIG. 3D
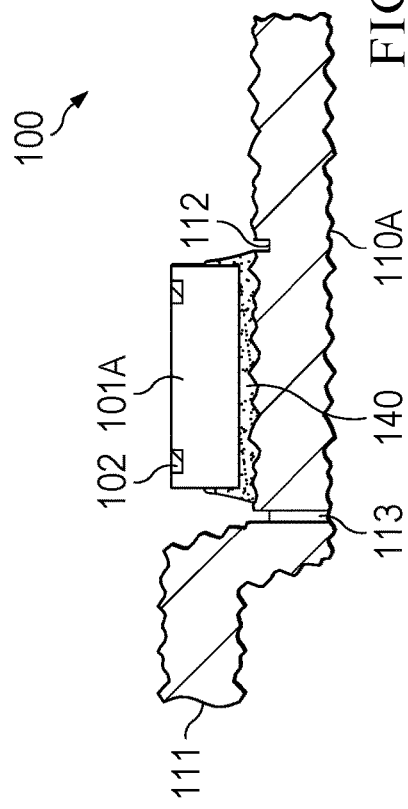
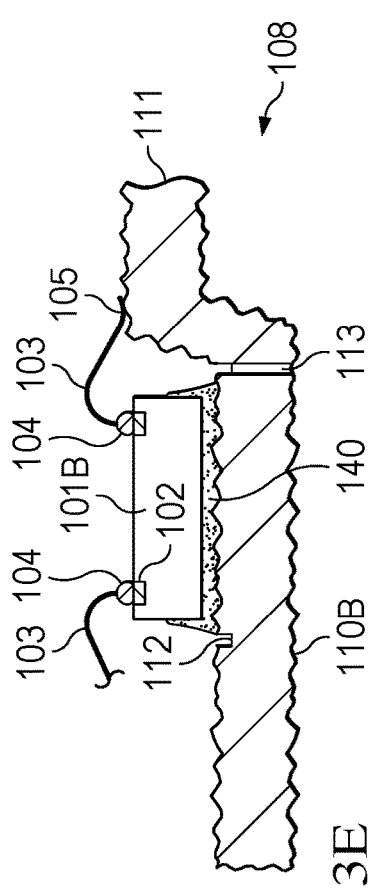
FIG. 3E
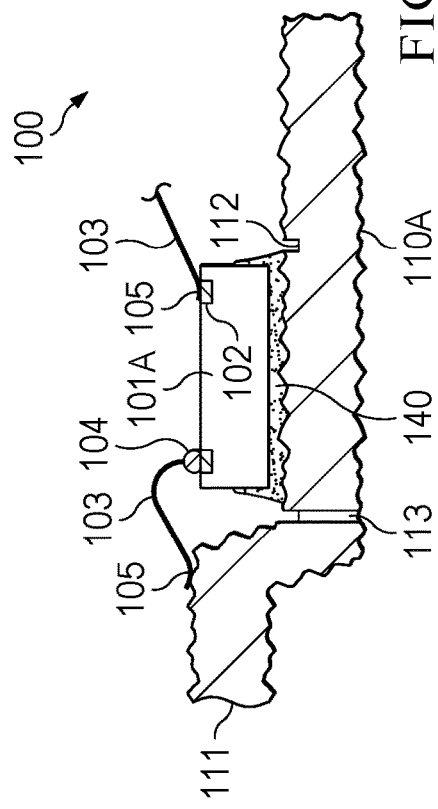

| # | OPTION | DRAWING | PROCESS | | | |
|---|---|---|---|---|---|---|
| | | | STAMPING | COINING | ETCHING | LASER MILLING |
| 1 | RECTANGULAR SHAPE |  | X | X | X | X |
| 2 | ROUND SHAPE 1 |  | X | X | X | X |
| 3 | ROUND SHAPE 2 |  | X | | X | X |
| 4 | TRIANGULAR SHAPE 1 |  | X | | | X |
| 5 | TRIANGULAR SHAPE 2 |  | X | | | X |
| 6 | "V" SHAPE |  | X | | | X |
| 7 | "W" SHAPE |  | X | | | X |
| 8 | COINING |  | | X | | X |

SEMICONDUCTOR PACKAGE SUBSTRATE WITH A SMOOTH GROOVE STRADDLING TOPSIDE AND SIDEWALL

TECHNICAL FIELD

This disclosure relates to semiconductor packages.

BACKGROUND

Semiconductor packages may include a leadframe with a pad and one or more leads, and a semiconductor die, such as an integrated circuit (IC) chip, bonded on the pad. The pad serves as a substrate providing a stable support for firmly positioning the semiconductor die within the semiconductor package during manufacturing, whereas the leads provide electrical connections from outside the package to the active surface of the semiconductor die. Leadframes are commonly manufactured from thin, such as about 120 to 250 micrometers (μm) thick sheets of base metal. The shape of the leadframe is stamped or etched from the original sheet. Base metals commonly used for leadframes include copper, copper alloys, aluminum, aluminum alloys, iron-nickel alloys, and nickel-cobalt ferrous alloys.

Gaps between the inner end of the leads and contact pads on the active surface of the semiconductor die are bridged by connectors, typically wire bonds-thin metal wires individually bonded to both the contact pads and the leads. Consequently, the surface of the inner lead ends has to be metallurgically suitable for attaching the wire bonds.

The end of the leads remote from the semiconductor die are configured for electrical and mechanical connection to external circuitry such as printed circuit boards. This attachment may include soldering, conventionally with a tin alloy solder at a reflow temperature above 200° Celsius. Consequently, the surface of the outer lead ends may have a metallurgical configuration suitable for reflow attachment to external parts.

Mold compound may cover the pad, the semiconductor die, and portions of the leads. In some examples, the mold compound may be an epoxy-based thermoset compound applied with a transfer molding process.

A number of techniques may be utilized to improve adhesion between semiconductor package materials, such as the leadframe and mold compound. As an example, adhesion between leadframe elements and epoxy-based mold compounds can be improved by adding a roughened surface to some or all leadframe elements. In some examples, textured features such as indentations, grooves, or protrusions to the leadframe surface. Another example to improve adhesion is the method to chemically modify the leadframe surface by oxidizing the metal surface, for instance creating a metal oxide layer, such as copper oxide. Copper oxide is known to adhere well to epoxy-based mold compounds.

Another example of known technology to increase adhesion between the leadframe and mold compound in semiconductor packages, is the roughening of the whole leadframe surface by chemically etching the leadframe surface after stamping or etching the pattern from a metal sheet. Chemical etching is a subtractive process using an etchant. When, for some device types, the roughening of the metal has to be selective, protective masks may be applied to restrict the chemical roughening to the selected leadframe areas; the application of masks is material-intensive and thus expensive. In some examples, chemical etching may create a micro-crystalline metal surface with a roughness on the order of 1 μm or less.

Yet another known method to achieve a roughened surface is the use of a specialized nickel-plating bath to deposit a rough nickel layer. This method is an additive process; a protective photomask may be used to restrict the deposition to selected leadframe portions. In some examples, a rough nickel layer may create a metal surface with a roughness on the order of 1 to 10 μm.

BRIEF SUMMARY

While techniques for roughened surfaces have improved adhesion between semiconductor package materials, such as a leadframe and mold compound, the roughened surfaces have created additional challenges. As one example, die attach adhesive flows more readily across a roughened leadframe surface than a smooth leadframe surface due to protuberances of the roughened surface interfering with surface tension forces of the liquid die attach adhesive that would otherwise restrict the flow of the die attach adhesive.

Semiconductor packages disclosed herein include leadframe substrates with generally roughened surfaces, but with grooves straddling topside and sidewall surfaces of the substrates. A groove restricts flow of die attach adhesive and/or resin bleed from the die attach adhesive, allowing for an increased fillet height of the adhesive compared to alternatives that do not restrict flow. In addition, grooves may be used to maintain a gap without die attach adhesive between two dies mounted to a common die pad substrate in a multichip package. The grooves straddling a topside and a sidewall of a leadframe prevent resin bleed from traversing the sidewall in addition to the topside. Such examples may be particularly advantageous to restrict the flow of die attach adhesive and/or resin bleed on pad leads integral with a die pad substrate.

In some examples, a groove may be implemented by stamping, coining, or etching the roughened surface of a leadframe, thereby tamping down protuberances forming the roughened surface along the topside and sidewall of the die pad substrate.

In one example, a semiconductor package includes a metallic substrate, the metallic substrate including a roughened surface, a semiconductor die including bond pads, and an adhesive between the roughened surface of a topside of the metallic substrate and the semiconductor die, therein bonding the semiconductor die to the metallic substrate. The adhesive includes a resin. The metallic substrate further includes a groove about a perimeter of the semiconductor die on the roughened surface, the groove having a surface roughness less than a surface roughness of the roughened surface of the metallic substrate. The groove straddles the topside and a sidewall of the metallic substrate.

In another example, a method for fabricating a semiconductor package includes applying an adhesive including a resin to a roughened surface of a topside of a metallic substrate, the groove having a surface roughness less than a surface roughness of the roughened surface. The groove straddles the topside and a sidewall of the metallic substrate. The method further includes positioning a semiconductor die including bond pads on the metallic substrate in contact with the adhesive such that the groove is about a perimeter of the semiconductor die on the roughened surface, and curing the adhesive to bond the semiconductor die to the metallic substrate.

BRIEF DESCRIPTION OF THE DRAWINGS

FIGS. 3A-3E illustrate conceptual process steps for manufacturing a semiconductor package with a groove straddling a topside and a sidewall of a leadframe, such as the semiconductor package of FIG. 1.

DETAILED DESCRIPTION

Figure 1:
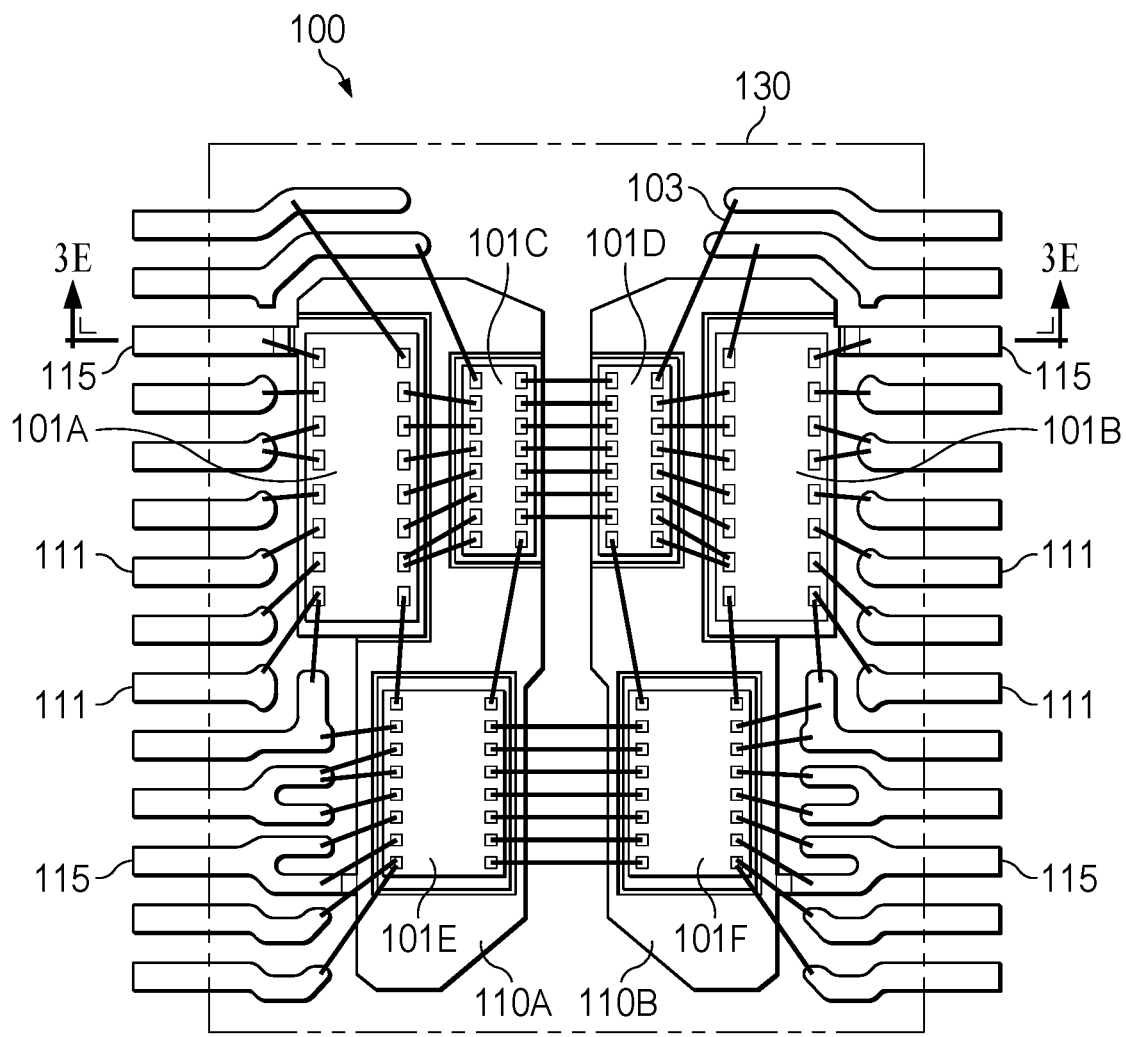
FIG. 1 is a top view of a semiconductor package with a groove straddling a topside and a sidewall of a leadframe, the groove restricting flow of die attach adhesive on the pad.

Semiconductor packages may include a metallic leadframe with a metallic pad, leads, and one or more semiconductor dies bonded on the pad. Semiconductor packages may further include a mold compound covering the pad, the semiconductor die(s), and portions of the leads. Such semiconductor packages may be created by a molding process, with a polymer compound, such as an epoxy formulation filled with inorganic granules, molded around an assembled semiconductor die and leadframe portions. In this process, a leadframe with the attached and bonded semiconductor die is placed in the cavity of a steel mold. Viscous mold compound is pressured into the cavity to fill the cavity and surround the semiconductor die and leadframe portions without voids. After polymerizing the compound, for example, by cooling to ambient temperature, the mold is opened, while the mold compound remains adhered to the molded parts.

The reliability of the adhesion between the mold compound and the covered parts of a semiconductor package depends on the integrity in time and temperature of the interfaces between the mold compound and the parts, as well as the ability to handle mechanical stresses during manufacture and operation. Mechanical interlocking of mold compound and parts may handle physical expansions and contractions based on different coefficients of thermal expansion to prevent delamination. A leadframe including a pad and leads may include a roughened surface in order to improve interlocking with the mold compound. In different examples, the roughened surface may be created using a variety of techniques, such as oxidation of a metal surface, chemical etching, and/or application of a rough nickel layer over a base metal of a leadframe.

However, die attach adhesive flows more readily across the roughened surface than a smooth surface of a leadframe. This result may cause difficulty in manufacturing of semiconductor packages. For example, with a roughened surface, a desired thickness of die attach adhesive on a pad of the leadframe may no longer be supported by its own surface tension, which may undesirably reduce a fillet height of the die attach adhesive on a semiconductor die mounted to the pad. As another example, while curing a die attach adhesive, resin of the die attach adhesive may bleed out more readily across the roughened surface than a smooth surface of a leadframe. Because mold compound may not adhere particularly well to die attach adhesive or its resin, leadframe surfaces covered by resin bleed may be more susceptible to delamination. Accordingly, controlling the flow of die attach adhesive and/or resin bleed may mitigate delamination and thus improve the robustness and reliability of semiconductor packages.

Semiconductor packages disclosed herein include leadframes with a generally roughened surface, but a groove straddling topside and sidewall surfaces. The groove may restrict flow of die attach adhesive, allowing for increased fillet height of the adhesive compared to alternatives that do not restrict flow. In the same or different examples, the groove may restrict the area of resin bleed from the die attach adhesive. The grooves straddling a topside and a sidewall of a leadframe prevent resin bleed from traversing the sidewall in addition to the topside. Such examples may be particularly advantageous to restrict the flow of die attach adhesive and/or resin bleed on pad leads integral with a die pad substrate. In some examples, the groove may be implemented by stamping, coining, or etching the roughened surface of the leadframe, thereby tamping down protuberances forming the roughened surface. One example of such a semiconductor package is described with respect to FIGS. 1-3E.

FIG. 1 is a top hidden view of semiconductor package 100. Semiconductor package 100 is a multichip module including six semiconductor dies 101A-101F (collectively, "dies 101") mounted to a metallic substrate including two metallic pads 110A, 110B (collectively, "pads 110") of a metallic leadframe 108. Semiconductor dies 101 may include any combination of semiconductor elements such as transistors and integrated circuits. In various examples of this disclosure, semiconductor dies 101 may be implemented using any semiconductor material employed in industry, such as a silicon, gallium arsenide, gallium nitride, silicon germanium, or other semiconductor material. In addition, the techniques of this disclosure may be applied to semiconductor packages with any number of semiconductor dies, including just a single semiconductor die, and any combination of active and passive components on a leadframe instead of, or in addition to, semiconductor dies 101.

Bond pads 102 of semiconductor dies 101 are electrically connected by wire bonds 103 to respective leads 111/115. Wire bonds 103 include a ball bond 104 (FIG. 3E) on one end to connect to a respective bond pad 102 (FIG. 3E) and a stitch bond 105 (FIG. 3E) to connect to a respective lead 111/115. Additional wire bonds 103 provide interconnections between bond pads 102 of dies 101.

Semiconductor package 100 further includes a mold compound 130 covering pads 110, semiconductor dies 101, and at least partially covering leads 111, such as covering only end portions of each of leads 111 adjacent to pads 110. Leads 111 of leadframe 108 enable solder attachment to a board, such as a printed circuit board.

In the example of semiconductor package 100, leads 103 are shaped as cantilevered leads; in other examples, the leads may have other configurations, including but not limited to, the shape of flat leads as used in Quad Flat No-Lead (QFN) devices or in Small Outline No-Lead (SON) devices.

Semiconductor package 100 further includes an adhesive 140 between the roughened surfaces of the topsides of the pads 110 and each semiconductor die 101, therein bonding the semiconductor die 101 to the metallic substrate. Pads 110 each include a number of grooves 112/113 forming perimeters surrounding each of semiconductor dies 101. Grooves 112 extend across a topside of pads 110 only, whereas each groove 113 straddles the topside and a sidewall of the metallic substrate of pads 110 along a pad lead 115. Grooves 112/113 restrict the flow of a resin bleed on pads 110 before and/or during the curing of die attach adhesive 140 to improve the mechanical interlocking of mold compound 130 and pads 110 by reducing the area of pads 110 covered by die attach adhesive and resin bleed. While grooves 112/113 are about a perimeter of the semiconductor dies 101, they may not entirely surround semiconductor dies 101. Further details of grooves 112/113 are described in FIG. 2 with respect to leadfame 108.

Figure 2:
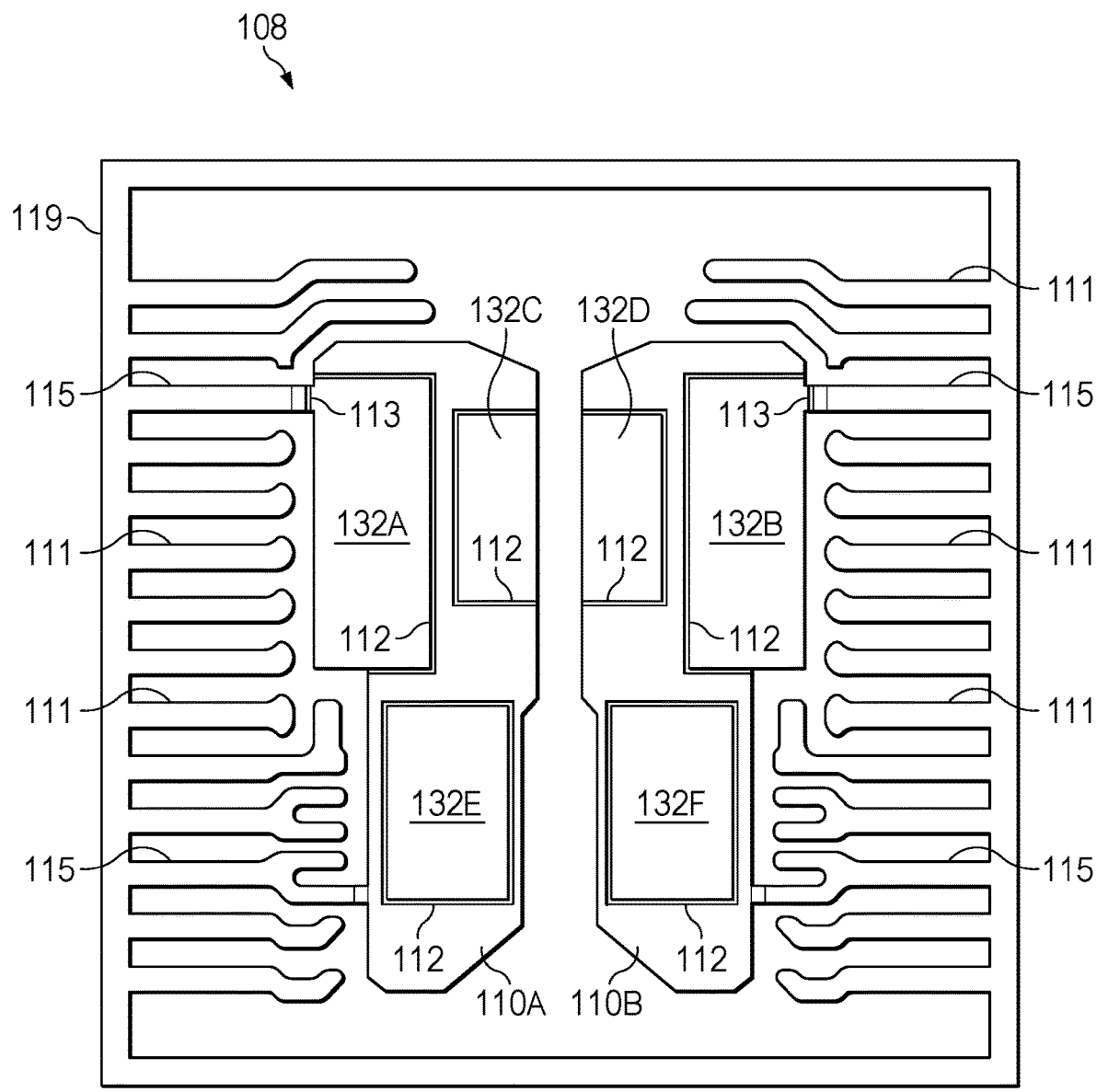
FIG. 2 is a top view of the leadframe of the semiconductor package of FIG. 1 prior to application of die attach adhesive, semiconductor dies, and mold compound.

FIG. 2 is a top view of the leadframe 108 of semiconductor package 100 prior to singulation from a leadframe strip (not shown). The leadframe strip includes an array of interconnected leadframes 108 for a plurality of semiconductor packages 100. Leadframe 108 includes a siderail 119, pads 110, leads 111, and pad leads 115, which connect pads 110 to siderail 119.

Leadframe 108 includes pads 110, leads 111 spaced from pads 110 by a gap, and pad leads 115. Pads 110 form a substrate providing a stable support for firmly positioning semiconductor dies 101 within semiconductor package 100. Pad leads 115 extend between pads 110 to an external surface of semiconductor package 100. Pad leads 115 function to support pads 110 within a leadframe strip prior to molding of mold compound 130 and singulation of semiconductor package 100 from an array of semiconductor packages manufactured on a common leadframe strip. Pad leads 115 also provide ground contacts for dies 101 via wire bond connections.

Pad 110A includes die mounting areas 132A, 132C, 132E, whereas pad 110B includes die mounting areas 132B, 132D, 132F (collectively, "mounting areas 132"). Die mounting areas 132A and 132B are adjacent to a sidewall of pads 110A, 110B respectively. Accordingly, to prevent resin bleed on the pad leads 115, grooves 113 straddle the topside and a sidewall of the metallic substrate. In contrast, locating grooves 113 only on the topside of pad leads 115 would allow resin bleed along the sidewalls of pad leads 115.

Leadframe 108, including pads 110 and leads 111, is shaped from a planar base metal of a consistent thickness. In various examples, the base metal of leadframe 108 may include copper, copper alloys, aluminum, aluminum alloys, iron-nickel alloys, or nickel-cobalt ferrous alloys. For many devices, the parallel surfaces of the flat leadframe base metal are treated to create strong affinity for adhesion to plastic compound, especially mold compounds. As an example, the surfaces of metal leadframes may be oxidized to create a metal oxide layer, such as copper oxide or chemically etched to form a micro-crystalline metal layer. Other methods include plasma treatment of the surfaces, or deposition of thin layers of other metals on the base metal surface.

In some examples, the planar base metal may be plated with a plated layer enabling metal-to-metal bonding and resistant to oxidation. In an example, the plated layer may include a layer of nickel plated on the base metal and a layer of palladium plated on the nickel layer. Some of such examples, a layer of gold may be plated on the palladium layer. As an example, for copper leadframes, plated layers of tin may be used, or a layer of nickel, about 0.5 to 2.0 µm thick in some examples, followed by a layer of palladium, about 0.01 to 0.1 µm thick in the same or different examples, optionally followed by an outermost layer of gold, about 0.003 to 0.009 µm thick in the same or different examples. Such base metal and plating combinations provide resistance to corrosion, such as oxidation, at exposed portions of the leadframe while facilitating wire bonds between leadframe 108 and bond pads 102 of semiconductor dies 101.

Leadframes, such as leadframe 108, are formed on a single sheet of metal by stamping or etching. Multiple interconnected leadframes may be formed from a single sheet of substrate, the interconnected leadframes referred to as a leadframe strip. Leadframes on the sheet can be arranged in rows and columns. Tie bars, such as pad leads 115, interconnect leads and other elements of a leadframe to one another as well as to elements of adjacent leadframes in a leadframe strip. A siderail, such as siderail 119 may surround the array of leadframes to provide rigidity and support leadframe elements on the perimeter of the leadframe strip. The siderail may also include alignment features to aid in manufacturing.

Usually die mounting, die to lead attachment, such as wire bonding, and molding to cover at least part of the leadframe and dies take place while the leadframes are still integrally connected as a leadframe strip. After such processes are completed, the leadframes, and sometimes mold compound of a package, are severed ("singulated" or "diced") with a cutting tool, such as a saw or laser. These singulation cuts separate the leadframe strip into separate semiconductor packages, each semiconductor package including a singulated leadframe, at least one die, electrical connections between the die and leadframe (such as gold or copper wire bonds) and the mold compound which covers at least part of these structures.

Tie bars and siderails may be separated during singulation of the packages formed with a single leadframe strip. The term leadframe represents the portions of the leadframe strip remaining within a package after singulation.

Pads 110 of leadframe 108 includes a roughened surface adjacent to die attach adhesive 140, which may improve adhesion between mold compound 130 and pads 110 and may also improve adhesion between pads 110 and die attach adhesive 140. The roughened surface of leadframe 108 covers at least the die attachment side of pads 110. In some examples, the roughened surfaces of leadframe 108 may include one side of all components of leadframe 108. In other examples, the roughened surfaces of leadframe 108 may include both sides of all components of leadframe 108 or may only cover the die attach side of pads 110.

Semiconductor dies 101 are bonded on pads 110 with die attach adhesive 140. Adhesive 140 includes a plurality of components including a resin. The resin may include epoxy resins, polyurethane resins, and/or silicone resins. The resin may be filled or unfilled and die attach adhesive 140 may further include one or more of the following: hardener, curing agent, fused silica, inorganic fillers, catalyst, flame retardants, stress modifiers, adhesion promoters, and other suitable components. Fillers, if any, may be selected to modify properties and characteristics of the resin base materials. Inert inorganic fillers may be selected to lower CTE (to match die), increase thermal conductivity, increase elastic modulus of adhesive 140 compared to the resin base. Particulate fillers may be selected to reduce strength characteristics such as tensile strength and flexural strength compared to the resin base materials.

Due to the roughened surface of pads 110, die attach adhesive 140 and/or resin bleed flows more readily across pads 110 than alternative substrates with smoother surface. Pads 110 further include grooves 112/113 surrounding semiconductor dies 101 on a roughened surface of pads 110. As referred to herein a groove, is an elongated recess in a surface of a component. In some examples, all surfaces of pads 110 are roughened except for the grooves 112/113; in other examples, only one side of pads 110 is roughened.

In some examples, the roughened surface of pads 110 may provide a surface roughness of at least 1.0 micrometers (µm), such as of at least 10 µm, or within a range of 1.0 µm to 50 µm. A surface roughness of grooves 112/113 may be less than half of the surface roughness of the roughened surface of pads 110, such as less than one fourth of the surface roughness of the roughened surface of pads 110 and/or less than 0.5 µm. In some examples, grooves 112/113 may be implemented by stamping, coining or etching the roughened surface of the leadframe, thereby tamping down protuberances forming the roughened surface.

Grooves 112/113 combine to extend about a rectangular perimeter on the surface of pads 110 that faces semiconductor dies 101. Grooves 112/113 are configured to restrict the flow of components of adhesive 140 from bleeding onto areas the roughened surface of pads 110 outside grooves 112/113. Because areas of resin bleed may inhibit adhesion between the roughened surface of pads 110 and mold compound 130, semiconductor package 100 may have improved adhesion between pads 110 and mold compound 130 compared to alternatives without grooves 112/113.

A length of each side of the rectangular perimeter formed by grooves 112/113 is greater than the length of the adjacent side of the corresponding semiconductor die 101, such as between 0 percent and 25 percent greater than the length of the adjacent side of the corresponding semiconductor die 101. For example, with a 2 mm by 2 mm die, a length of each side of the rectangular perimeter may be between 2.1 mm and 2.5 mm, such as about 2.25 mm. In other examples, grooves 112/113 may form a different shape on the surface of pads 110.

In the same or different examples, grooves 112/113 may have a depth of at least the surface roughness of the roughened surface of pads 110, such as within a range of 1 µm to 50 µm, such as within a range of 20 µm to 30 µm, such as about 25 µm. A width of grooves 112/113 may be at least wide as the depth of grooves 112/113, such as between 1-3 times the depth of grooves 112/113. In some of such examples, the width of grooves 112/113 may be within a range of 2 µm to 100 µm, such as within a range of 10 µm to 60 µm, such as such as within a range of 25 µm to 50 µm.

While semiconductor dies 101 are bonded to pads 110, bond pads 102 of semiconductor dies 101 are electrically connected to each other and to leads 111/115 with wire bonds 103. For example, wire bonds 103 may include a metal wire extending from a respective bond pad 102 to a respective lead 111. The metal wires of wire bonds 103, are made of electrically conductive materials, such as copper, gold, or aluminum. Each of wire bonds 103 include a ball bond by a squashed ball attached the respective bond pad 102, and a stitch bond attached to the respective lead 111.

A wire bonding process may begin with positioning semiconductor dies 101 on a heated pedestal to raise the temperature to between 150 and 300° C. For copper and aluminum wires, ball formation and bonding may be performed in a reducing atmosphere such as dry nitrogen gas with a few percent hydrogen gas.

With the wire bonding process, the wire is strung through the capillary of an automated bonder. A capillary is an elongated tube of an inert material such as a ceramic with a fine bore (the capillary in the strict sense) suitable for guiding a metal wire used to form the wire bonds. At the wire end extruding from the capillary tip, a free air ball may be created by melting the wire end using either a flame or a spark technique. The capillary is moved towards an attachment area of either leadframe 108 or one of bond pads 102. For a bond pad, the attachment area may be an alloy of aluminum and copper, for an attachment area of the leadframe, the attachment area may consist of the leadframe base metal or include one of the coating metal discussed above. The free air ball of melted wire is pressed against the metallization of the attachment area by a compression force, often combined with ultrasonic movement of the ball relative to the attachment area, transmitting ultrasonic energy, in order to create a ball bond, such as ball bond 104.

The bonding process results in a metal nail head or squashed ball, such as ball bond 104. In a specific example of ball bond 104, the attachment process of squashing free air balls against the metal, such as aluminum, of bond pads 102 may create layers of intermetallic compounds.

In other examples, the attachment process of squashing free air balls against a different metal, such as palladium or gold, which may be associated with plated leads 111 creates metal interdiffusion. Metal interdiffusion is also the process which provides strength to stitch bonds, such as stitch bond 105, where ultrasonic agitation is not provided.

After the ball attachment, the capillary with the wire may be lifted to span an arch from the ball bond, such as ball bond 104, to an attachment area on a substrate or a leadframe, such as a lead stitch area of one of leads 111. When the wire touches the attachment area surface, the capillary tip is pressed against the wire in order to flatten it and thus to form a stitch bond, such as stitch bond 105, sometimes referred to as a wedge bond.

Mold compound 130 forms an overmold that covers leadframe pads 110, semiconductor dies 101, wire bonds 103, as well as end portions of leads 111 with stich bonds 105. Mold compound 130 provides a protective outer layer for semiconductor dies 101 and wire bonds 103 formed in a molding process. In some examples, mold compound 130 includes an epoxy such as an epoxy-based thermoset polymer. Reliable adhesion between the packaging compound and the covered parts supports satisfactory operation of semiconductor devices since delamination degrades the capability to keep moisture and impurities out and interferes with conductive heat dissipation. As discussed previously, roughened surfaces of leadframe 108 improve adhesion between components of leadframe 108 and mold compound 130.

FIGS. 3A-3E illustrate conceptual process steps for manufacturing a semiconductor package 100. FIG. 4 is a flowchart of a method of fabricating a semiconductor package with a groove straddling a topside and a sidewall of a leadframe, such as such as semiconductor package 100. For clarity, the method of FIG. 4 is described with reference to semiconductor package 100 and FIGS. 3A-3E; however, the described techniques may be adapted to other package designs and are not limited to the specific example of semiconductor package 100.

First, the shape of a leadframe strip, including leadframe 108 (FIG. 2) as one of a plurality of interconnected leadframes, is patterned in a base metal, such as a copper (FIG. 4, step 402). In various examples, manufacturing a leadframe strip may include stamping or photo etching a planar base metal to form the shape of the leadframe strip. The leadframe strip includes multiple interconnected leadframes 108 with pads 110 and leads 111, as well the elements to interconnect adjacent leadframes, such as pad leads 115 and optional siderail(s) 119.

At least one side of the base metal is treated to provide a roughened surface (FIG. 4, step 404). In different examples, one or more of a variety of techniques may create the roughened surface, such as mechanically adding textured features such as indentations, grooves or protrusions to the leadframe surface, oxidation of a surface of the base metal or a plated metal, chemical etching, and/or application of a rough nickel layer over a base metal of a leadframe.

Figure 3A:
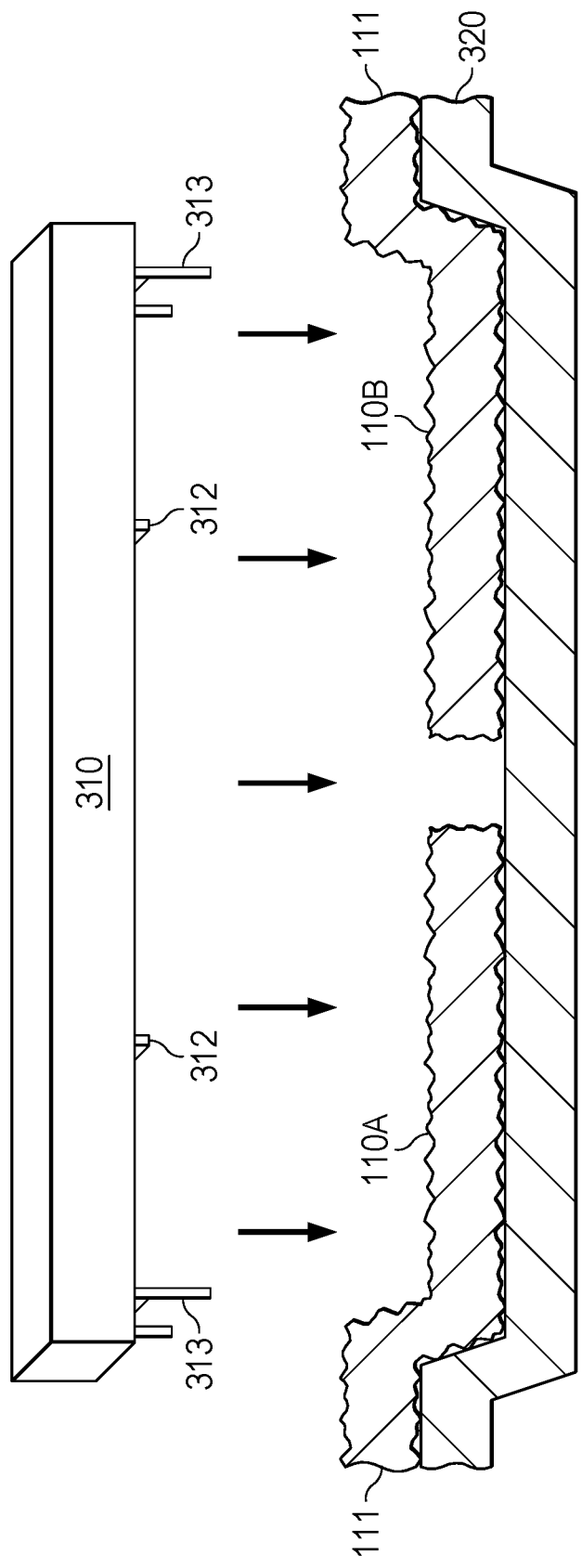
Figure 3B:
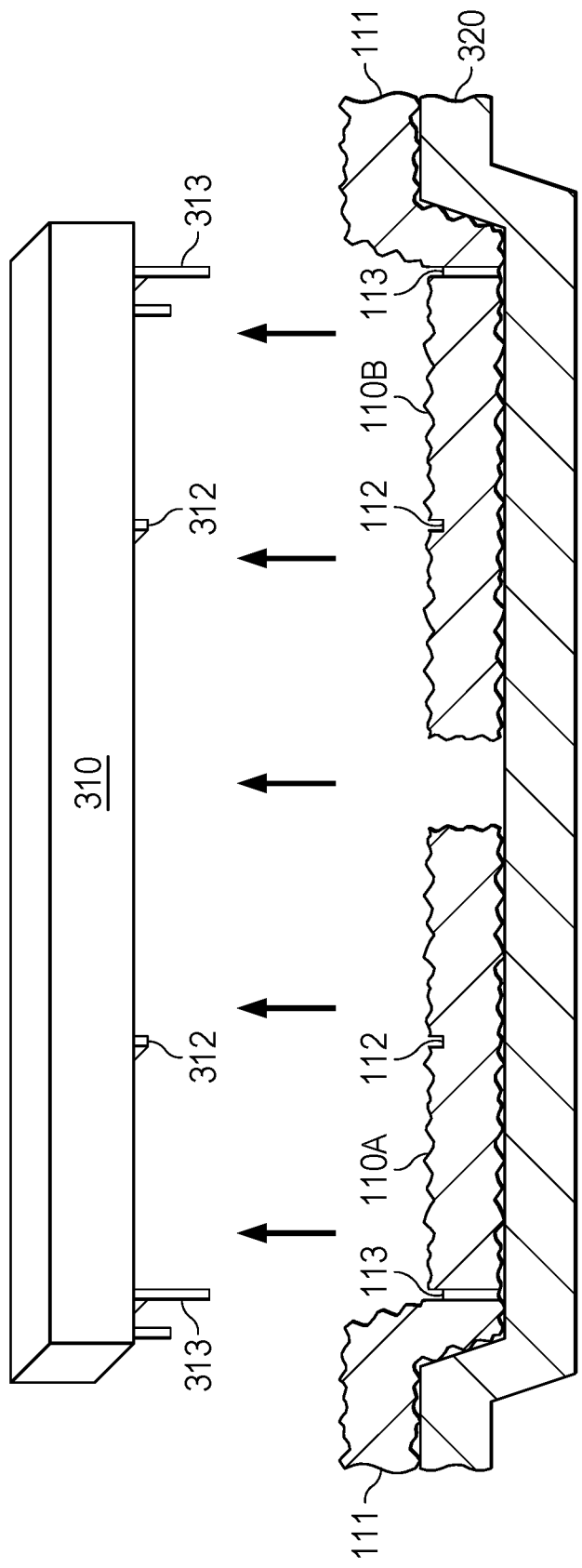
Figure 4:
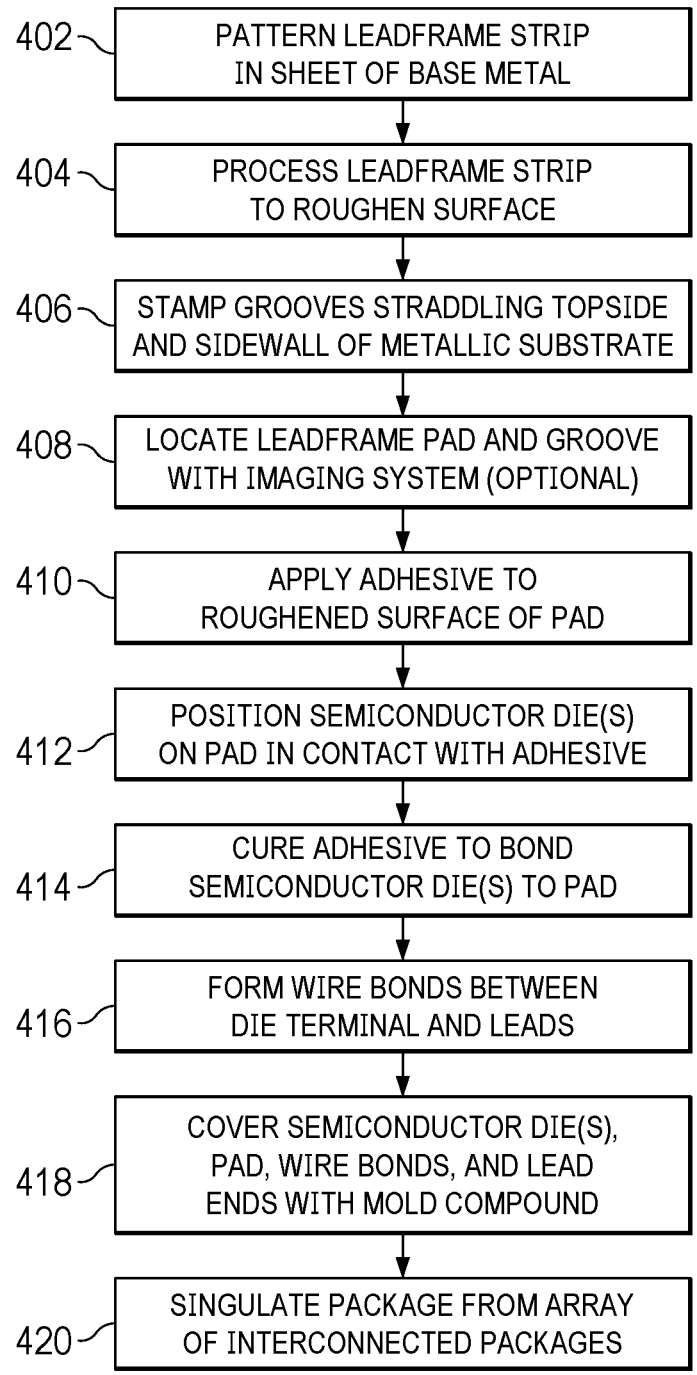
FIG. 4 is a flowchart of a method of fabricating a semiconductor package with a groove straddling a topside and a sidewall of a leadframe, such as the semiconductor package of FIG. 1.

As shown in FIG. 3A, leadframe 108, as part of a leadframe strip, is placed in a stamp including an upper die 310 with rectangular protrusions 312, u-shaped presses 313, and a bottom die 320 serving as a platform for a stamping operation. As shown in FIG. 3B, upper die 310 stamps the roughened surface of pads 110 to form grooves 112 with rectangular protrusion 312 and further form grooves 113 straddling the topside and a sidewall of the metallic substrate of pads 110 with u-shaped presses 313 (FIG. 4, step 406). U-shaped presses 313 are sized to conform to the topside and a sidewall of the metallic substrate of pads 110 at the corresponding pad leads 115 to form the topside and the sidewall portions of grooves 113 simultaneously. For example, U-shaped presses 313 may conform to the rectangular profile of pad leads 115 with an interference fit matching the of grooves along the sidewall of the pad leads 115. As leadframe 108 is part of a leadframe strip, upper die 310 may include additional protrusions to stamp grooves into each pad of the other leadframes of the leadframe strip in unison.

Figure 3C:
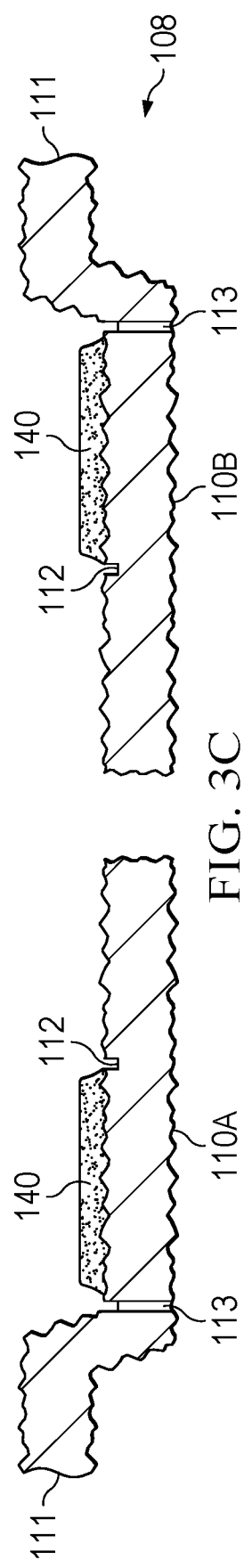

FIGS. 3C-3E illustrate steps for bonding semiconductor dies 101 to a roughened surface of pads 110 about a perimeter formed by grooves 112/113 on the surface of pads 110. As an optional step, an imaging system may be used to locate pads 110 to assist in automated placement of semiconductor dies 101 on pads 110 (FIG. 4, step 408). As part of this process, the imaging system may identify a location of grooves 112/113. For example, grooves 112/113 may be detected as having a lighter color than the roughened surface of pads 110. In addition, the roughened surface of pads 110 may present a darker color than a smooth pad in alternative examples. Imaging systems used to aid in the placement of semiconductor dies 101 on pads 110 may have difficulty detecting locations of the roughened surfaces of leadframe 108. Thus, grooves 112/113 may help imaging systems detect the location of pads 110 and die mounting areas 132, even when the roughened surfaces of leadframe 108, including pads 110, are not readily detectable by the imaging system.

As shown in FIG. 3C, using a known location of pads 110, adhesive 140 is applied to the roughened surface of pads 110 of leadframe 108 inside of a perimeter formed by grooves 112/113 (FIG. 4, step 410). Die attach adhesive 140 may represent a thermal interface material, such as a conductive or nonconductive thermal paste. Such examples may facilitate heat dissipation from semiconductor dies 101 through pads 110. As part of applying adhesive 140, the location of pads 110 may be determined based on known positions of alignment features of a leadframe strip and/or using an optional imaging system. In various examples, the adhesive may be applied to contact grooves 112/113 or may be applied leaving a space between adhesive 140 and grooves 112/113 When adhesive contacts grooves 112/113 the thickness of the adhesive may increase compared to examples in which the adhesive flows freely on the roughened surface without contacting grooves 112/113.

As shown in FIG. 3D, again using a known location of pads 110, semiconductor dies 101 is placed on pads 110 in contact with adhesive 140 such that grooves 112/113 surrounds semiconductor dies 101 on the roughened surface (FIG. 4, step 412). Bond strength between adhesive 140 and mold compound 130 may be significantly less than bond strength between adhesive 140 and semiconductor dies 101 and between mold compound 130 and semiconductor dies 101. Thus, controlling contact areas between adhesive 140 and semiconductor dies 101 and contact areas between mold compound 130 and semiconductor dies 101 may provide desired adhesion between semiconductor dies 101 and both adhesive 140 and mold compound 130. For example, the fillet height of adhesive 140 on semiconductor dies 101 may be about half a thickness of semiconductor dies 101. Such a configuration allows adhesive 140 to bond to the sides of semiconductor dies 101 while leaving a portions of the sides of semiconductor dies 101 available to bond to mold compound 130.

As shown in FIG. 3D, adhesive 140 is cured to bond semiconductor dies 101 to pads 110 (FIG. 4, step 414). Curing adhesive 140 may include holding the assembly of leadframe 108 and semiconductor dies 101 at a prescribed temperature for a prescribed period of time. During curing, resin components of adhesive 140 may bleed forming resin bleed. Grooves 112/113 prevent the resin from bleeding onto the roughened surface of pads 110 outside grooves 112/113.

Bond strength between adhesive 140 or resin bleed and mold compound 130 may be less than bond strength between pads 110 and mold compound 130. Accordingly, constraining the area of resin bleed may improve adhesion between pads 110 and mold compound 130 by leaving more surfaces of pads 110 uncovered and available for direct contact with mold compound 130.

As shown in FIG. 3E, wire bonds 103 are formed between the bond pads 102 of semiconductor dies 101 and leads 111 (FIG. 4, step 416). Wire bonds 103 are formed from its bond pads 102 to adjacent leads 111 and with a wire using a capillary of a metal wire bonder. For example, forming wire bonds 103 may include forming a free air ball, squashing the ball onto bond pad 102 to form a ball bond 104, spanning the wire to the corresponding lead 111, pressuring the wire to the lead to form stitch bond 105, and breaking the wire.

Following the formation of wire bonds 103, the assembly of leadframe 108, semiconductor dies 101, adhesive 140, and wire bonds 103 is covered in mold compound 130 (FIG. 4, step 418). Mold compound 130 is molded around the assembled semiconductor dies 101 and leadframe 108 portions. In this process, leadframe 108 with the attached and bonded semiconductor dies 101 is placed in the cavity of a mold, such as a steel mold. The heated and viscous mold compound, such as an epoxy resin filled with inorganic granules, is pressured into the cavity to fill the cavity and surround semiconductor dies 101 and leadframe 108 portions without voids. Mold compound 130 covers pads 110 and end portions of leads 111. After polymerizing the mold compound and cooling to ambient temperature, the mold is opened, while mold compound 130 remains adhering to the molded parts. As leadframe 108 is part of a leadframe strip, all the leadframe and die assemblies of the leadframe strip may be molded in unison. Individual semiconductor packages remain interconnected as part of a leadframe strip after being covered with mold compound 130.

For the finished semiconductor package 100, mold compound 130 and the assembled components are expected to retain reliable adhesion during testing and operations of semiconductor package 100 without delamination. The roughened surfaces of leadframe 108 support improved adhesion to mold compound 130 to mitigate the prevalence of delamination in semiconductor package 100.

Following molding of mold compound 130, semiconductor package 100 is singulated from the array of interconnected packages manufactured on leadframe strip (FIG. 4, step 420). For example, singulation may include cutting through the leadframe strip to separate semiconductor package 100 from a plurality of semiconductor packages 100 manufactured on leadframe strip. Portions of the leadframe strip may be discarded following singulation, such as siderail 119. Following singulation, leads 111/115 may be bent into their final positions, if needed.

Figure 5:
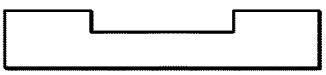
FIG. 5 is a plan view of options for grooves straddling a topside and a sidewall of a leadframe.
Figure 5:
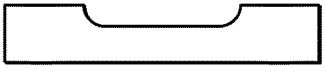
Figure 5:
Figure 5:
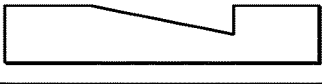
Figure 5:
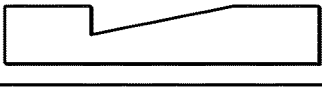
Figure 5:
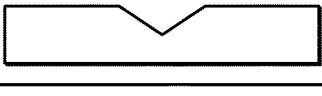
Figure 5:
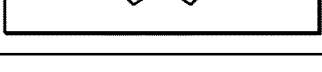
Figure 5:
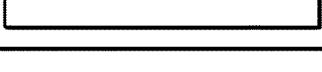

FIG. 5 illustrates possible grooves profiles that can be implemented as grooves 112, 113. FIG. 5 also lists the processes by which the grooves can be made such as stamping, coining and etching as they are associated with each type of groove. The list is exemplary and is not a complete list of all possible groove profiles. When implemented as part of a groove, the illustrated profiles would be extended along a length of a surface to form an elongated groove. Such examples may include a consistent groove profile, or the groove profile may vary over a length of an elongated groove.

The specific techniques for semiconductor packages with a groove straddling a topside and a sidewall of a leadframe, such as semiconductor package 100, are merely illustrative of the general inventive concepts included in this disclosure as defined by the following claims. As an example, this disclosure applies not only to semiconductor packages with a groove straddling topside and sidewall surfaces of a lead on the substrate, but also to other semiconductor packages with different substrates, such as nonconductive organic substrates whereby the substrate includes a groove straddling topside and sidewall surfaces of the substrate and a semiconductor bonded to the substrate with an adhesive.

What is claimed is:

1. A semiconductor package comprising:
   a metallic substrate, the metallic substrate including a roughened surface;
   a semiconductor die including bond pads; and
   an adhesive between the roughened surface of a topside of the metallic substrate and the semiconductor die, therein bonding the semiconductor die to the metallic substrate, wherein the adhesive includes a resin,
   wherein the metallic substrate further includes a groove about a perimeter of the semiconductor die on the roughened surface, the groove having a surface roughness less than a surface roughness of the roughened surface of the metallic substrate,
   wherein the groove straddles the topside and a sidewall of the metallic substrate.

2. The semiconductor package of claim 1, wherein the semiconductor die is a first semiconductor die, the adhesive is a first adhesive, and the groove is a first groove, the package further comprising a second semiconductor die bonded to the topside of the metallic substrate by a second adhesive, wherein the metallic substrate further includes a second groove about a perimeter of the second semiconductor die on the roughened surface, with the first adhesive separated from the second adhesive by a portion of the metallic substrate between the first groove and the second groove.

3. The semiconductor package of claim 1, wherein the groove is configured to prevent the resin of the adhesive from bleeding onto the roughened surface of the metallic substrate outside the groove.

4. The semiconductor package of claim 1, wherein a resin bleed of the adhesive is adjacent to at least a portion of the groove.

5. The semiconductor package of claim 1, wherein the adhesive is adjacent to at least a portion of the groove.

6. The semiconductor package of claim 1, wherein the groove forms a rectangular shape about the semiconductor die on the roughened surface.

7. The semiconductor package of claim 1, wherein all surfaces of the metallic substrate are roughened except for the groove.

8. The semiconductor package of claim 1,
   wherein a surface roughness of the metallic substrate is at least 1.0 micrometers (µm), and
   wherein a surface roughness of the groove is less than 0.5 micrometers (µm).

9. The semiconductor package of claim 1, wherein a side of the metallic substrate including the roughened surface includes one or more of a group consisting of:
   a metal oxide layer;
   a micro-crystalline metal layer; and
   a rough nickel layer.

10. The semiconductor package of claim 1, wherein the metallic substrate includes a metallic pad adjacent to the semiconductor die and a pad lead integral with and extending from the metallic pad, wherein the groove straddles the topside and the sidewall of the pad lead of the metallic substrate.

11. The semiconductor package of claim 10, further comprising a wire bond extending between one of the bond pads of the semiconductor die and the pad lead.

12. The semiconductor package of claim 11, further comprising:
    additional leads spaced from the metallic pad by a gap; and
    additional wire bonds extending between the bond pads of the semiconductor die and the additional leads spaced from the metallic pad by the gap.

13. The semiconductor package of claim 12, wherein the semiconductor die is a first semiconductor die, the adhesive is a first adhesive, and the groove is a first groove, the package further comprising a second semiconductor die bonded to the topside of the metallic substrate by a second adhesive, wherein the metallic substrate further includes a second groove about a perimeter of the second semiconductor die on the roughened surface, with the first adhesive separated from the second adhesive by a portion of the metallic substrate between the first groove and the second groove.

14. The semiconductor package of claim 12, further comprising mold compound covering the semiconductor die, the adhesive, the roughened surface of the metallic substrate, and at least partially covering the pad lead and the additional leads.

* * * * *